US005306920A

United States Patent [19]

King et al.

[11] Patent Number: 5,306,920
[45] Date of Patent: Apr. 26, 1994

[54] ION IMPLANTER WITH BEAM RESOLVING APPARATUS AND METHOD FOR IMPLANTING IONS

[75] Inventors: Jerry S. King, Chandler; Carl E. D'Acosta, Mesa; Craig L. Jasper; Dan A. Banks, both of Phoenix, all of Ariz.

[73] Assignee: Motorola, Inc., Schaumburg, Ill.

[21] Appl. No.: 980,062

[22] Filed: Nov. 23, 1992

[51] Int. Cl.$^5$ .............................................. H01J 37/09
[52] U.S. Cl. ................... 250/492.21; 250/505.1
[58] Field of Search ................ 250/398, 492.21, 505.1

[56] References Cited

U.S. PATENT DOCUMENTS

| | | | |
|---|---|---|---|
| 4,017,403 | 4/1977 | Freeman | 250/492.21 |
| 4,847,504 | 7/1989 | Aitken | 250/492.23 |
| 4,916,322 | 4/1990 | Glavish et al. | 250/492.21 |
| 4,943,728 | 7/1990 | Dykstra et al. | 250/492.21 |
| 5,025,167 | 6/1991 | Okuda et al. | 250/398 |
| 5,026,997 | 6/1991 | Benveniste | 250/492.23 |

*Primary Examiner*—Bruce C. Anderson
*Attorney, Agent, or Firm*—Joe E. Barbee

[57] ABSTRACT

An ion implantation apparatus including a resolving aperture-shutter assembly (31) placed in the ion beam path (18). The resolving aperture-shutter assembly includes a movable shutter (34) and a shutter housing surrounding the movable shutter (34). Selected ions in an ion beam path (18) pass through a hole (44) in movable shutter (34) when the movable shutter (34) is in a first position, and are blocked by the solid surfaces when the movable shutter (34) is in a second position. The enclosure (32, 33, 39) completely surrounds the movable shutter (34). The enclosure (32, 33, 39) includes a first aperture (42) aligned with the ion beam path (18) for allowing the selected ions to enter the enclosure and a second aperture (41) aligned with the ion beam path (18) for allowing the selected ions to exit the enclosure after passing through the hole (44) in the movable shutter.

10 Claims, 3 Drawing Sheets

ION IMPLANTER WITH BEAM RESOLVING APPARATUS AND METHOD FOR IMPLANTING IONS

BACKGROUND OF THE INVENTION

This invention relates, in general, to ion implanters, and more particularly, to ion implanters with resolving apertures and shutters.

Ion implanters are able to implant ions in a controllable profile into a substrate. Ion implantation is a popular method for introducing dopant atoms into semiconductor and semi-insulating substrates during the manufacture of electronic devices. Ion implantation provides accurate dose control of chosen atomic species, and provides greater uniformity of dose across a semiconductor wafer.

Ion implanters include a source chamber in which gasses containing the desired atomic species are introduced and ionized. The ions are extracted from the source chamber in a beam by electromagnetic acceleration. The extracted ion beam then passes through an analyzing magnet that diverts ions selected by atomic mass from the extracted beam and redirects the selected ions on a second beam path. The ions in the second beam path are then accelerated towards a semiconductor substrate.

Some ion implanters include a shutter for controllably blocking the selected ions and additional discrimination of unwanted ions. The shutter serves to stop implantation when the semiconductor substrate has received a desired dose, and so is important for dose control. Unfortunately, conventional shutter structures allow a significant beam current leakage of selected ions to escape beyond the shutter even when the shutter is in an ion-blocking position.

Until recently, it was difficult to accurately measure this low level beam current leakage, and so manufacturers were not aware of its existence or significance. Shutter leakage causes significant dose variation. Moreover, even when the shutter is open, the desired ion beam current varies significantly due to beam current leakage past conventional aperture-shutter assemblies. A measure of this variation is referred to as beam stability. Beam stability also affects dose uniformity in the semiconductor wafer.

What is needed is a resolving beam shutter with significantly reduced leakage that provides improved beam stability and dose control for ion implantation.

SUMMARY OF THE INVENTION

Briefly stated, the advantages of the present invention are achieved by an ion implantation apparatus including an ion source that emits ions along a first beam path, selects ions of a desired mass from the first beam path, and redirects the selected ions on a second beam path. A movable shutter is placed in the second beam path. The movable shutter includes a solid surface and a hole located so that the selected ions in the second beam path pass through the hole when the movable shutter is in a first position, and are blocked by the solid surface when the movable shutter is in a second position. An enclosure completely surrounds the movable shutter ensuring a complete and positive beam barrier. The enclosure includes a first aperture aligned with the second beam path for allowing the selected ions to enter the enclosure and a second aperture aligned with the second beam path for allowing the selected ions to exit the enclosure after passing through the hole in the movable shutter.

DETAILED DESCRIPTION OF THE DRAWINGS

Figure 1:
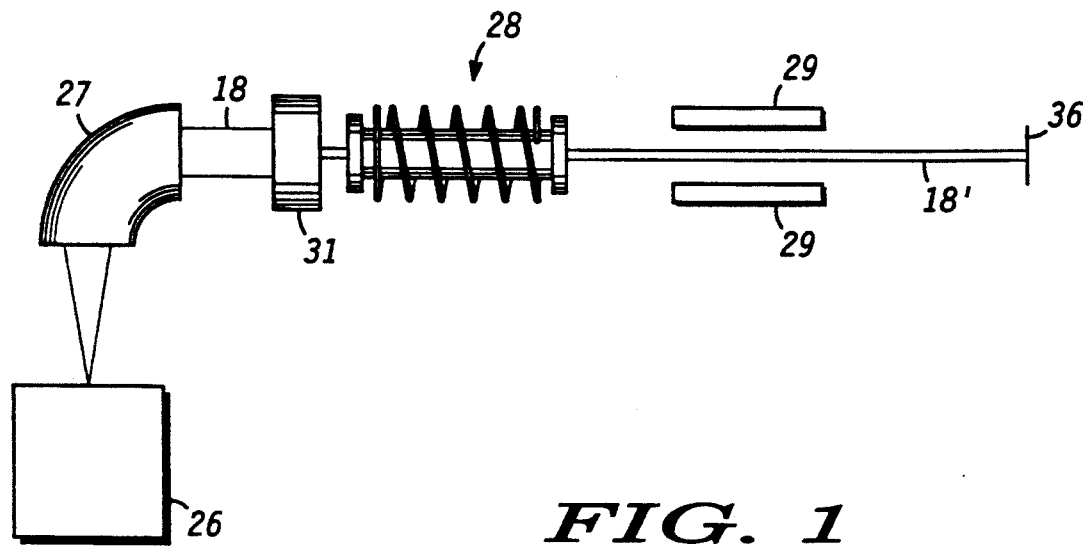
FIG. 1 illustrates a schematic view of an ion implantation apparatus.

FIG. 1 illustrates a simplified schematic drawing of an ion implantation apparatus including a resolving aperture-shutter assembly 31 in accordance with the present invention. Ion source 26 generates ions of a desired dopant species in a plasma. The ions are drawn out of ion source 26 along a first beam path towards analyzing magnet 27. Analyzing magnet 27 serves to select ions of a desired mass from the first beam path and redirect the selected ions on a second beam path 18. Ions then travel to resolving aperture-shutter assembly 31, which further defines the shape, size, and composition of the ion beam. Resolving aperture-shutter assembly 31 is described in greater detail in reference to FIG. 4 and FIG. 5.

A resolved ion beam 18' exits resolving aperture-shutter assembly 31 and is electromagnetically accelerated in acceleration tube 28 towards workpiece 36. Usually, a variety of focusing and raster scanning plates such as plates 29 are used to steer resolved ion beam 18 towards workpiece 36. Usually, workpiece 36 is a crystalline substrate for use in manufacturing electronic devices integrated circuits.

Until now, manufacturers of ion implanters have ignored leakage that occurs through resolving aperture-shutter assembly 31. The term "leakage" means any ion beam current that passes through or around resolving aperture-shutter assembly 31 that is not confined in the intended resolved ion beam 18'. The inventors of the present invention recognized that conventional resolving aperture-shutter designs resulted in significant variation in implant dose into workpiece 36. They experimentally confirmed that leakage through prior art resolving aperture-shutter assembly 11, shown in FIG. 2, was a source of this variation. Recognition of this problem led to the discovery of the resolving aperture-shutter assembly 31 in accordance with the present invention.

Figure 2:
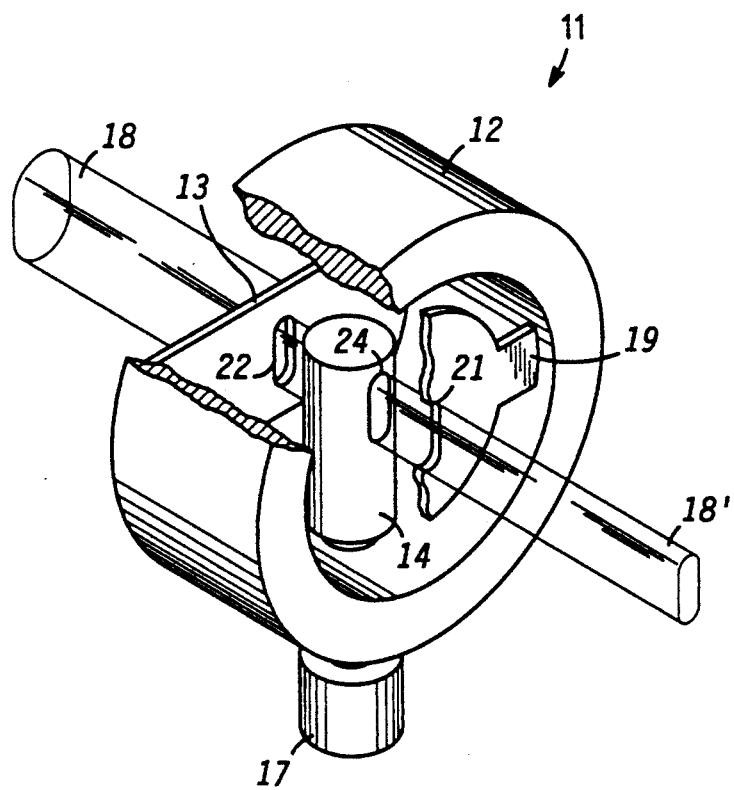
FIG. 2 illustrates a cut away perspective view of a portion of a prior art resolving aperture-shutter assembly for an ion implantation apparatus.

Important features of the resolving aperture-shutter assembly 31 in consonance with the present invention are best understood by comparison to prior art resolving aperture-shutter assembly 11 shown in FIG. 2. Resolving aperture-shutter assembly 11 includes a frame 12 upon which are mounted a front aperture plate 13 and a back aperture plate 19. Both front aperture plate 13 and back aperture plate 19 are smaller than an interior area of frame 12, leaving a large open area between edges of the aperture plates 13 and 19 and the inside edge of frame 12. A front resolving aperture 22 is positioned in front aperture plate 13 in alignment with ion beam 18.

The ion beam passes through a hole 24 in movable shutter 14. A drive coupler 16 extends outside of frame 12 and couples shutter 14 to a drive means or actuator 17 that powers motion in movable shutter 14. As shown in FIG. 2, drive means 17 can rotate movable shutter 14 so that hole 24 moves out of alignment with ion beam 18, and ion beam 18 is blocked by the solid surface of movable shutter 14.

It is important to note that movable shutter 14 in the prior art resolving aperture-shutter assembly 11 extends minimally above hole 24. Likewise, previous movable shutters included only minimal lateral extensions on either side of hole 24. In other words, the height and diameter of movable shutter 14 were not considered to be critical to the functioning of resolving aperture-shutter assembly 11. These features of the prior art resolving aperture-shutter assembly 11 are a result of widely held beliefs that ion beam 18 was sufficiently confined so that minimal shutter surface area could adequately and controllably block ion beam 18. After passing through movable shutter 14, resolved ion beam 18' exits resolving aperture-shutter assembly 11 through back aperture 21.

Figure 3:
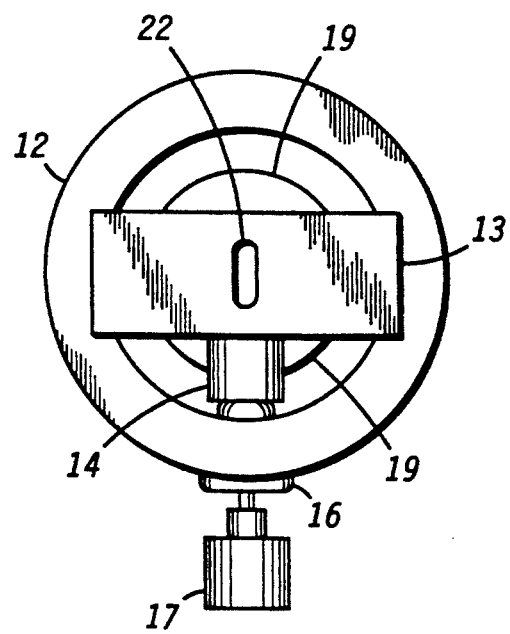
FIG. 3 illustrates a front view of the prior art resolving aperture-shutter assembly shown in FIG. 1 and FIG. 2.

FIG. 3 illustrates prior art resolving aperture-shutter assembly 11 looking at front aperture plate 13 towards back aperture plate 19. Portions of movable shutter 14 that are obscured by front aperture plate 13 are illustrated in phantom. FIG. 3 illustrates the large amount of open area between the aperture plates 13 and 19 and frame 12. These open areas are shaded in FIG. 3 to aid understanding. FIG. 3 also illustrates that the aperture plates and solid surfaces of movable shutter 14 extend only minimally around aperture 22.

Figure 4:
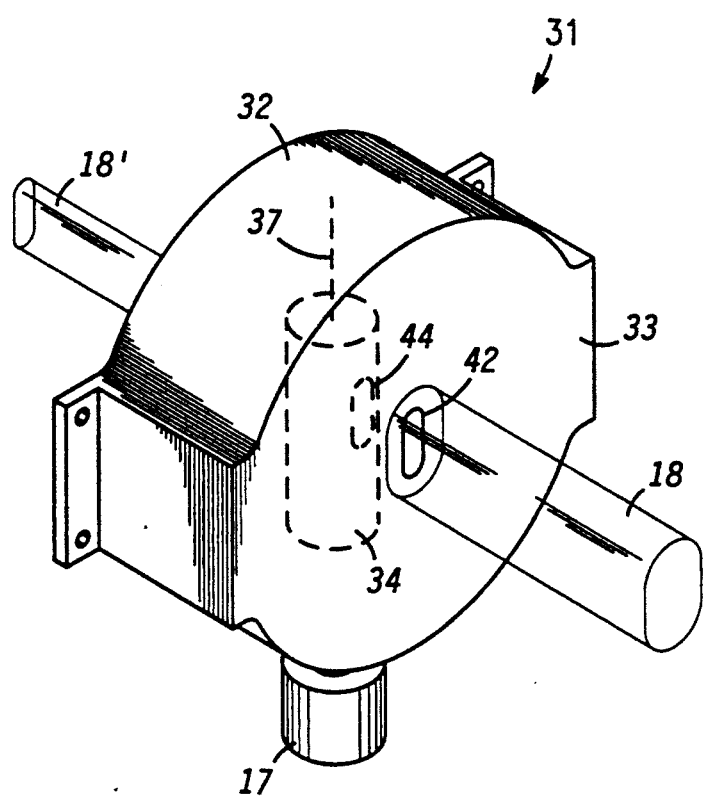
FIG. 4 illustrates a perspective view of a portion of a resolving aperture-shutter assembly for an ion implantation apparatus in accordance with the present invention.

FIG. 4 shows a perspective view of a resolving aperture-shutter assembly 31 in accordance with the present invention. For clarity and ease of illustration, frame 12 is not shown in FIG. 4. Extended movable shutter 34 is illustrated in phantom as it is completely enclosed by a shutter housing. The shutter housing includes an enclosing surface 32, a back surface 39 (visible in FIG. 5), and a front surface 33 that form a complete enclosure for extended movable shutter 34. Preferably, the shutter housing components comprise a material such as aluminum, graphite, or other material capable of blocking ion beam 18. Front aperture 42 is formed in front surface 33 and is aligned with ion beam 18 to allow ion beam 18 to enter resolving aperture-shutter assembly 31.

Extended movable shutter 34 is preferably a cylindrically shaped hollow or solid tube and in the preferred embodiment extends vertically above and laterally on both sides of hole 44. In the preferred embodiment, drive coupler 16 (shown in FIG. 5) couples shutter drive means 17 to extended movable shutter 34 so that extended movable shutter 34 can be rotated about an axis illustrated by a dashed line labeled 37. Hole 44 is desirably elliptically shaped and has an axis positioned orthogonally to axis 37. Extended movable shutter 34 operates by rotating hole 44 in and out of alignment with ion beam 18. Solid surfaces of extended movable shutter 34 block ion beam 18, while hole 44 allows beam 18 to pass through.

Figure 5:
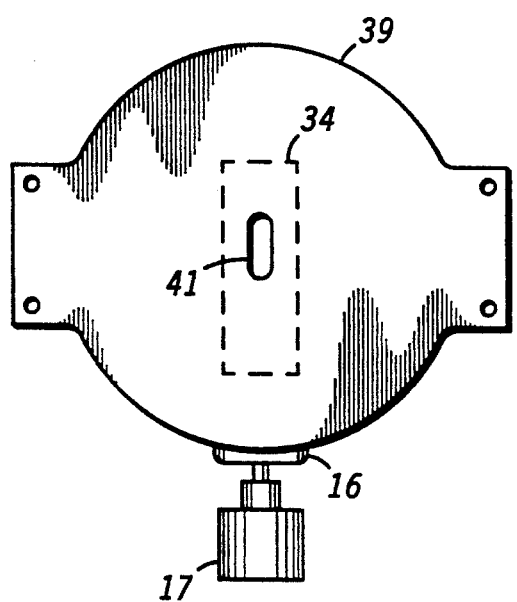
FIG. 5 illustrates a back view of the resolving aperture-shutter assembly shown in FIG. 4.

FIG. 5 illustrates resolving aperture-shutter assembly 31 looking at back surface 39 towards extended movable shutter 34 (shown in phantom). Comparison of the resolving aperture-shutter assembly shown in FIG. 5 with the prior art assembly shown in FIG. 3 reveals that all of the open areas that existed in the prior art design are minimized. Experiments show that this feature greatly improves control of ion beam 18 (shown in FIG. 4). Back resolving aperture 41 is located in back surface 39 and is aligned with hole 44 of extended movable shutter 34.

The vantage of FIG. 5 also points out that extended movable shutter extends significantly above hole 44 and back resolving aperture 41. This feature improves beam blocking ability when the extended movable shutter 34 is closed, and improves beam control when extended movable shutter 34 is open. In a preferred embodiment, the solid surface of extended movable shutter 34 is at least 7.5 centimeters long and extends at least 2.5 centimeters above and below hole 44. Extended movable shutter 34 could also extends laterally at least 1.11 centimeters on each side of hole 44 and has a diameter of 2.5 to 5.0 centimeters or larger.

By now it should be appreciated that a resolving beam shutter with reduced leakage is provided. Reduced leakage results in improved ion beam stability and greater control over dose uniformity. An extended movable shutter with extended solid surfaces improves beam control. Also, a housing that completely encloses the movable shutter further improves beam stability and dose control.

We claim:

1. An ion implantation apparatus comprising: an ion source that emits ions along a first beam path; a means for selecting ions of a desired mass from the first beam path and redirect the selected ions on a second beam path; a movable shutter placed in the second beam path, wherein the movable shutter includes a solid surface and a hole located so that the selected ions in the second beam path pass through the hole when the movable shutter is in a first position, and are blocked by the solid surface when the movable shutter is in a second position; and an enclosure completely surrounding the movable shutter to reduce ion beam leakage, wherein the enclosure includes a first aperture aligned with the second beam path for allowing the selected ions to enter the enclosure and a second aperture aligned with the second beam path for allowing the selected ions to exit the enclosure after passing through the hole in the movable shutter.

2. The ion implantation apparatus of claim 1 wherein the solid surface of the movable shutter extends at least 2.5 centimeters above and below the hole.

3. The ion implantation apparatus of claim 1 wherein the enclosure comprises graphite.

4. The ion implantation apparatus of claim 1 wherein the enclosure comprises aluminum.

5. The ion implantation apparatus of claim 1 wherein the movable shutter is cylindrically shaped and an axis of the hole is positioned orthogonally to the axis of the cylinder.

6. The ion implantation apparatus of claim 1 further comprising:
means for accelerating the selected ions after exiting the enclosure; and
means for steering the selected ions after acceleration towards a work piece.

7. A resolving beam shutter for an ion implantation apparatus comprising: an enclosure having a first aperture for receiving an ion beam and a second aperture for emitting the ion beam; and a movable shutter positioned inside the enclosure so as to intercept the ion beam, wherein the shutter includes a hole for allowing the ion beam to pass through the shutter to the second aperture when the shutter is in a first orientation with respect to the enclosure, and to block the ion beam when the shutter is in a second orientation with respect to the enclosure, wherein the enclosure completely surrounds the movable shutter to reduce ion beam leakage.

8. The resolving beam shutter for an ion implantation apparatus of claim 7 wherein the movable shutter is cylinder-shaped and has a diameter in the range of 2.5 to 3.8 centimeters and a length of at least 7.5 centimeters, wherein the movable shutter is mounted to the enclosure so that it rotates about an axis through the length of the movable shutter.

9. The resolving beam shutter for an ion implantation apparatus of claim 7 wherein a lower portion of the movable shutter extends outside of the enclosure and the lower end is coupled to a means for rotating the shutter.

10. A method for implanting ions into a workpiece comprising the steps of: providing an ion source chamber; creating an ion plasma in the ion source chamber; extracting a beam of ions from the ion source chamber; analyzing the beam of ions on the basis of mass to produce an analyzed ion beam having a second beam path; passing the analyzed ion beam through a first resolving aperture into an enclosure; providing a movable shutter inside the enclosure, wherein the enclosure completely surrounds the movable shutter, and wherein the movable shutter includes a solid surface and a hole located so that the analyzed ion beam passes through the hole when the movable shutter is in a first position, and is blocked by the solid surface when the movable shutter is in a second position; positioning the movable shutter in the first position; passing the analyzed ion beam through a second aperture to provide a resolved ion beam exiting the enclosure; accelerating the resolved ion beam towards a workpiece; and positioning the movable shutter in the second position when the workpiece has received a predetermined dose of the resolved ion beam.

* * * * *